(12) United States Patent
Lee et al.

(10) Patent No.: US 9,679,959 B2
(45) Date of Patent: Jun. 13, 2017

(54) CAPACITOR AND CONTACT STRUCTURES, AND FORMATION PROCESSES THEREOF

(71) Applicant: GLOBALFOUNDRIES Inc., Grand Cayman (KY)

(72) Inventors: Ki Young Lee, Poughquag, NY (US); Sanggil Bae, Clifton Park, NY (US); Jae Ho Joung, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 134 days.

(21) Appl. No.: 14/837,288

(22) Filed: Aug. 27, 2015

(65) Prior Publication Data

US 2015/0364540 A1 Dec. 17, 2015

Related U.S. Application Data

(62) Division of application No. 13/648,504, filed on Oct. 10, 2012, now Pat. No. 9,178,009.

(51) Int. Cl.
*H01L 49/02* (2006.01)
*H01L 27/108* (2006.01)

(52) U.S. Cl.
CPC ........ *H01L 28/60* (2013.01); *H01L 27/10805* (2013.01)

(58) Field of Classification Search
CPC . H01L 27/1255; H01L 28/60; H01L 23/5223; H01L 27/0629; H01L 27/3265; H01L 28/40; H01L 28/75; H01L 27/0805; H01L 21/7685; H05K 3/061; H01G 4/306; H01G 4/33
See application file for complete search history.

(56) References Cited

U.S. PATENT DOCUMENTS

| 5,918,135 A | 6/1999 | Lee et al. |
| 6,119,335 A | 9/2000 | Park et al. |
| 6,166,423 A * | 12/2000 | Gambino ................ H01L 28/55 257/532 |

(Continued)

OTHER PUBLICATIONS

Lee et al., "Methods of Forming Semiconductor Devices Having Capacitor and Via Contacts," U.S. Appl. No. 13/232,075, filed Sep. 14, 2011.

*Primary Examiner* — Dion R Ferguson
(74) *Attorney, Agent, or Firm* — Heslin Rothenberg Farley and Mesiti PC; Nicholas Mesiti

(57) ABSTRACT

Capacitor and contact structures are provided, as well as methods for forming the capacitor and contact structures. The methods include, for instance, providing a layer of conductive material above a conductive structure and above a lower electrode of a capacitor; etching the layer of conductive material to define a conductive material hard mask and an upper electrode of the capacitor, the conductive material hard mask being disposed at least partially above the conductive structure; and forming a first conductive contact structure and a second conductive contact structure, the first conductive contact structure extending through an opening in the conductive material hard mask and conductively contacting the conductive structure, and the second conductive contact structure conductively contacting one of the lower electrode of the capacitor, or the upper electrode of the capacitor.

15 Claims, 9 Drawing Sheets

(56) References Cited

U.S. PATENT DOCUMENTS

| | | | |
|---|---|---|---|
| 6,333,224 B1 | 12/2001 | Lee | |
| 6,405,431 B1 | 6/2002 | Shin et al. | |
| 6,479,850 B2 | 11/2002 | Lee | |
| 6,633,497 B2 | 10/2003 | Nickel | |
| 6,649,464 B2 | 11/2003 | Lee | |
| 6,783,999 B1 | 8/2004 | Lee | |
| 6,806,096 B1 | 10/2004 | Kim et al. | |
| 6,853,003 B2 | 2/2005 | Lee | |
| 6,881,999 B2 | 4/2005 | Lee et al. | |
| 7,084,024 B2 | 8/2006 | Gluschenkov et al. | |
| 7,101,804 B2 | 9/2006 | Choi et al. | |
| 7,232,736 B2 | 6/2007 | Lee | |
| 7,262,065 B2 | 8/2007 | Mitsui et al. | |
| 7,285,490 B2 | 10/2007 | Barth et al. | |
| 7,462,535 B2 | 12/2008 | Lee et al. | |
| 7,465,604 B2 | 12/2008 | Heo | |
| 7,575,984 B2 | 8/2009 | Radigan et al. | |
| 7,615,460 B2 | 11/2009 | Ueda | |
| 7,755,196 B2 | 7/2010 | Barth et al. | |
| 7,989,224 B2 | 8/2011 | Gaidis | |
| 2004/0180508 A1* | 9/2004 | Park | H01L 28/60 438/393 |
| 2007/0291441 A1* | 12/2007 | Inoue | H01L 23/5223 361/306.2 |
| 2013/0065375 A1* | 3/2013 | Lee | H01L 23/5223 438/381 |
| 2014/0098459 A1 | 4/2014 | Lee et al. | |
| 2014/0159199 A1* | 6/2014 | Lee | H01L 28/60 257/532 |

\* cited by examiner

CAPACITOR AND CONTACT STRUCTURES, AND FORMATION PROCESSES THEREOF

CROSS REFERENCE TO RELATED APPLICATIONS

This application is a divisional application of U.S. patent application Ser. No. 13/648,504, filed Oct. 10, 2012, and entitled "METHODS OF FORMING A CAPACITOR AND CONTACT STRUCTURES," the entirety of which is hereby incorporated herein by reference.

FIELD OF THE INVENTION

The present invention relates generally to devices and methods of fabricating devices, such as semiconductor devices which include one or more capacitors and multiple conductive contact structures.

BACKGROUND OF THE INVENTION

As integration density of semiconductor devices increases, the area occupied by individual devices continues to shrink. Notwithstanding this, a capacitor for storing data of, for instance, a dynamic random access memory (DRAM) is required to have a sufficient capacitance, irrespective of the decrease in the area occupied by the capacitor. Accordingly, a metal-insulator-metal (MIM) capacitor, in which a lower electrode and an upper electrode are formed of metal and separated by a layer of insulating material, is being used in many integrated circuit products. Additionally, MIM capacitors have been used extensively in semiconductor devices that perform analog-to-digital conversions and digital-to-analog conversions. Conversion between analog and digital signals requires that capacitors employed in such conversion be stable, i.e., the capacitance of the capacitors must be relatively stable over a range of applied voltages and temperatures. The capacitance of capacitors with polysilicon electrodes tends to be relatively unstable since the capacitor structures tend to vary with changes in temperature and applied voltage. Accordingly, capacitors with polysilicon electrodes are typically not used for such conversion applications.

In forming the upper and lower metal electrodes of a MIM capacitor, an etching process is typically performed to pattern a metal layer. However, as the integration density of semiconductor devices continues to increase, it is becoming more difficult to etch such metal layers. In particular, copper which has good electro-migration resistance and a desirable low resistivity, can be difficult to etch. Accordingly, various methods for forming the upper and lower metal electrodes through a damascene process, that is, a process which does not involve etching a metal layer, have been proposed. See, for example, U.S. Letters Pat. No. 6,649,464 B2. A copper damascene process generally includes forming a trench for a copper structure in an insulation layer, forming a sufficient amount of copper to overfill the trench, and removing the excess copper from the substrate, thereby leaving the cooper structure in the trench. However, the damascene process used in forming copper-based capacitors and conductive lines and vias is time-consuming and expensive, and includes many steps, where chances for creating undesirable defects always exist.

Accordingly, there is a need for enhanced capacitor structures and formation processes, for example, for use in semiconductor device fabrication, which better integrate with conductive contact formation processing.

BRIEF SUMMARY

The shortcomings of the prior art are overcome and advantages are provided through the provision, in one aspect, of a method which includes: providing a layer of conductive material above a conductive structure and above a lower electrode of a capacitor; etching the layer of conductive material to define a conductive material hard mask and an upper electrode of the capacitor, the conductive material hard mask being disposed at least partially above the conductive structure; and forming a first conductive contact structure and a second conductive contact structure, the first conductive contact structure extending through an opening in the conductive material hard mask and conductively contacting the conductive structure, and the second conductive contact structure conductively contacting one of the lower electrode of the capacitor or the upper electrode of the capacitor.

In a further aspect, a device is presented which includes a conductive structure and a lower electrode of a capacitor disposed within an insulating layer. A layer of conductive materials is disposed above the conductive structure and the lower electrode of the capacitor, and is etched to define a conductive material hard mask at an upper electrode of the capacitor. The conductive material hard mask is disposed at least partially above the conductive structure. The device further includes a first conductive contact structure and a second conductive contact structure. The first conductive contact structure extends through an opening in the conductive hard mask and conductively contacts the conductive structure, and the second conductive contact structure conductively contacts one of the lower electrode of the capacitor or the upper electrode of the capacitor.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
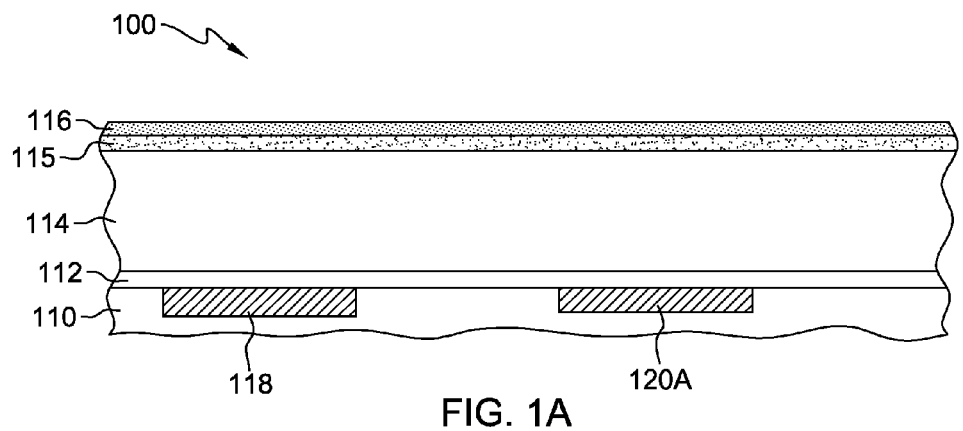
FIGS. 1A-1L depict illustrative processes of forming a device which includes a capacitor and multiple conductive contact structures, in accordance with one or more aspects of then present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating embodiments of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Generally stated, disclosed herein are certain novel capacitor and conductive contact structures and methods for fabricating the same, which are particularly suitable for sub-100 nm semiconductor fabrication technology. In sub-100 nm technology, certain back-end-of-line (BEOL) processes may employ a metal film as a hard mask for a dual damascene process. For example, self-aligned via contacts may require metal films to increase selectivity during the via etch, that is, the hard mask is provided to act as a resist during via etching. In accordance with the concepts disclosed herein, processes and structures are disclosed which utilize as the metal-insulator-metal capacitor upper electrode a BEOL hard mask. This is accomplished, for instance, by introducing an additional oxide chemical-mechanical polish, as described further below. As a result, very accurate and conformal MIM capacitors may be provided together with conductive contact structures, which processing advantageously saves costs in metal film deposition and oxide hard mask deposition steps by optimizing the process sequence. In addition, the processes disclosed herein can be readily used between any of the metal layers of a device, such as between the contact and metal 1 layers, between the metal 1 and metal 2 layers, etc. Advantageously, the processes disclosed may be employed to conductively connect to the upper electrode, as well as the lower electrode, of the MIM capacitor, which may be advantageously employed, depending on the particular circuit design being fabricated. In accordance with the concepts disclosed herein, a designer is provided with enhanced connection solutions to underlying conductive structures, such as metal lines, as well as to the electrodes of, for example, a MIM capacitor. Processing approaches are provided which allow for connecting to both the upper electrode and the lower electrode simultaneously, that is, using the same processing steps, which provides more degree of design freedom to the circuit designer.

More particularly, a method is presented herein which includes: providing a layer of conductive material above a conductive structure and above a lower electrode of a capacitor; etching the layer of conductive material to define a conductive material hard mask and an upper electrode of the capacitor, the conductive material hard mask being disposed at least partially above the conductive structure; and forming a first conductive contact structure and a second conductive contact structure. The first conductive contact structure extends through an opening in the conductive material hard mask and conductively contacts the conductive structure, and the second conductive contact structure conductively contacts one of the lower electrode of the capacitor or the upper electrode of the capacitor.

In enhanced aspects, the forming of the first and second conductive contact structures may include simultaneously forming the first and second conductive contact structures, and/or simultaneously forming a third conductive contact structure which conductively contacts to the other of the lower electrode or the upper electrode of the capacitor. This forming may further include performing a chemical-mechanical polishing process to simultaneously reduce a height of the first conductive contact structure and the second conductive contact structure.

The method may further include forming an insulating layer over the conductive structure and the lower electrode of the capacitor, wherein the insulating layer is a non-conductive diffusion barrier layer. This non-conductive diffusion barrier layer may be disposed between the lower and upper electrodes of the capacitor, or alternatively, be replaced by a portion of a dielectric layer or a portion of a hard mask layer. The layer of conductive material may be one or more of a metal, titanium, tantalum, titanium nitride, or tantalum nitride. In one example, the conductive structure may be a conductive metal line, and forming the first conductive contact structure and the second conductive contact structure may include forming a first conductive copper line and at least one first conductive copper via in conductive contact with the conductive structure, and forming a second conductive copper line and at least one second conductive copper via in conductive contact with one of the lower electrode of the capacitor or the upper electrode of the capacitor. This forming of the first conductive copper line, the at least one first conductive copper via, the second conductive copper line, and the at least one second conductive copper via, may include employing a damascene process. Further, the method may include forming the conductive structure and the lower electrode of the capacitor in a layer of insulating material, wherein the conductive structure and the lower electrode are fabricated of copper, and the method includes forming the conductive structure and the lower electrode of the capacitor utilizing a damascene process.

Reference is made below to the drawings, which are not drawn to scale for ease of understanding, wherein the same reference numbers used throughout different figures designate the same or similar components.

FIGS. 1A-1L depict processes for forming a device which includes a capacitor and multiple conductive contact structures, in accordance with one or more aspects of the present invention.

FIG. 1A is a simplified view of a portion of a device 100, such as a semiconductor device, at an intermediate stage of manufacturing. Device 100 may be formed above a substrate, such as a semiconductor substrate (not shown). At the point of fabrication depicted in FIG. 1A, device 100 includes an illustrative first insulating layer 110, a non-conductive diffusion barrier layer 112, a second insulating layer 114, a first hard mask layer 115, a second hard mask layer 116, a conductive structure 118, e.g., a conductive line, and a lower electrode 120A of what will become a MIM capacitor. The various layers depicted in FIG. 1A may be formed from a variety of different materials, and they may be formed by performing a variety of techniques, such as a chemical-vapor deposition (CVD), an atomic layer deposition (ALD), physical vapor deposition (PVD), or plasma-enhanced versions of such processes. The thicknesses of such layers may also vary, depending upon the particular application.

For example, in one illustrative embodiment, the first insulating layer 110 may include a material such as silicon dioxide, silicon oxynitride, low-k silicon dioxide, etc. In one specific example, the first insulating layer 110 may be a layer of silicon dioxide having a thickness of about 100-500 nm that is initially formed by performing a CVD process. As another example, in one illustrative embodiment, the non-conductive diffusion barrier layer 112 may include a material, such as silicon nitride, NBLoK™, silicon carbonide, a nitrogen-doped silicon carbide, etc., that will help prevent or at least reduce any undesirable migration of the conductive materials in the conductive structure 118 and/or the lower electrode 120A. In one specific example, the non-conductive diffusion barrier layer 112 may be a layer of NBLoK™ having a thickness of about 20-40 nm that is initially formed by performing a CVD process.

Continuing with the discussion of FIG. 1A, in one illustrative embodiment, the second insulating layer 114 may include a material such as a so-called low-k insulating material (k value is less than 2.7), an ultra-low-k insulating material (k value of less than 2.3), silicon dioxide, OMCTS (Octamethyleyelotetrasiloxane) oxide film, etc. In one specific example, the second insulating layer 114 may be a layer of a low-k insulating material having a thickness of about 100-500 nm that is initially formed by performing a CVD process. In one illustrative embodiment, the first hard mask layer 115 may be any of a variety of materials such as, for example, a TEOS-based silicon dioxide, silicon nitride, etc. In one specific example, the first hard mask layer 115 may be a layer of TEOS-based silicon dioxide having a thickness of about 30-40 nm that is initially formed by performing a CVD process. Among other things, the first hard mask layer 115 acts to protect the underlying second layer of insulating material 114. It should also be noted that, if desired or warranted by a particular process flow, a second hard mask layer 116 may be formed above first hard mask layer 115. This second hard mask layer 116 may be made of a variety of materials, and it may have an increased hardness relative to the hardness of the first hard mask layer 115.

Still referring to FIG. 1A, the schematically depicted conductive structure 118 may be any of a variety of conductive materials, such as copper, copper manganese, silver, etc., and it may be formed using a variety of known techniques. In one specific example, the conductive structure 118 is a copper line that is formed using known damascene techniques. The conductive structure 118 may be part of the overall metallization system for the device 100. Of course, the size, shape, and configuration of the conductive structure 118 may vary, depending upon the particular application. In one specific example, the conductive structure 118 may have a thickness that ranges from about 40-60 nm. So as not to obscure the present invention, various details and layers associated with the formation of the conductive structure 118 are not depicted in the drawings. For example, one or more barrier layers (not shown) would typically be formed in a trench 119 prior to depositing the conductive material, e.g., copper in the trench 119.

Similarly, lower electrode 120A may be any of a variety of conductive materials, such as copper, copper manganese, silver, etc., and it may be formed using a variety of techniques. The thickness of the lower electrode 120A may also vary, depending upon the particular application. In one illustrative embodiment, the lower electrode 120A may include copper, and be formed using known damascene techniques, and have a thickness of about 40-60 nm. The lateral width of the lower electrode 120A may also vary, depending upon the particular application. Any barrier layers that may be formed as part of the process of forming lower electrode 120A are not depicted in FIG. 1A so as not to obscure the different aspects of the present invention.

Figure 1B:
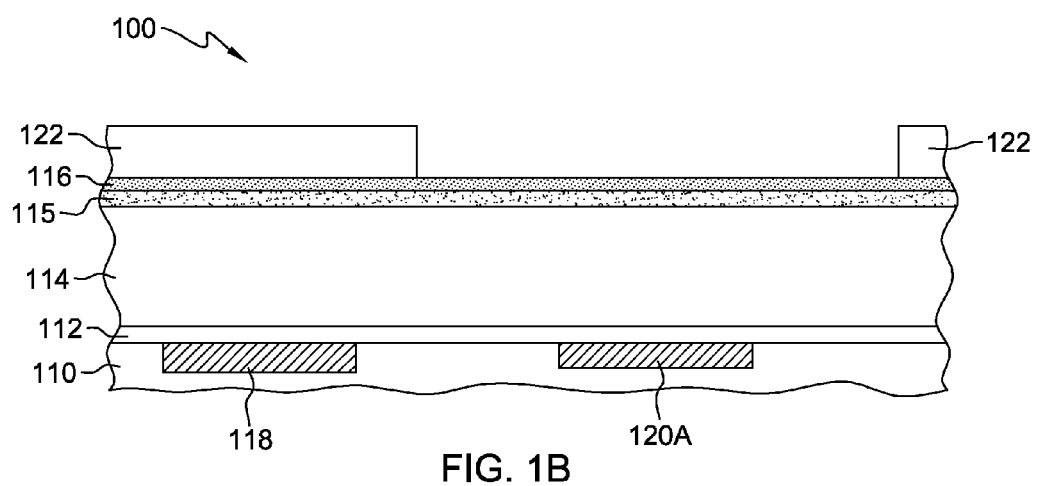

FIG. 1B depicts the intermediate structure of FIG. 1A after provision of a patterned mask layer 122 over second hard mask layer 116. Patterned mask layer 122 may be formed of any of a variety of materials, such as a photoresist material, and may be formed using photolithography techniques. In the embodiment illustrated, an opening is provided in patterned mask layer 122 aligned over lower electrode 120A of device 100.

Figure 1C:
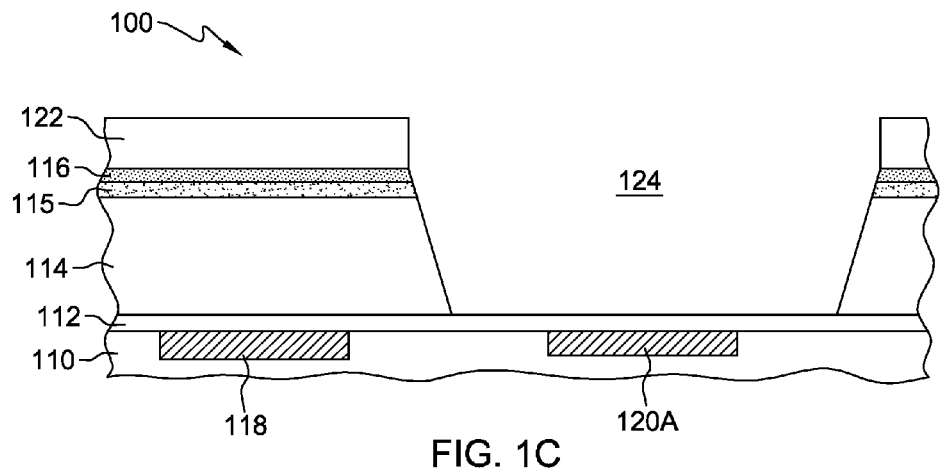

Next, as shown in FIG. 1C, one or more etching processes are performed through patterned mask layer 122 to define an opening 124 in the device. Either dry or wet-etch processing may be employed in forming opening 124. In one illustrative embodiment, opening 124 is formed by performing dry anisotropic etching processing to define the opening, with appropriate changes in the etch chemistry of such etching processes as may be required to etch through the second hard mask layer 116, first hard masks layer 115, and second layer of insulating material 114. In this example, opening 124 exposes a portion of non-conductive diffusion barrier layer 112 disposed over lower electrode 120A. Note, however, that the size and configuration of opening 124 may vary, depending upon the particular application.

Figure 1D:
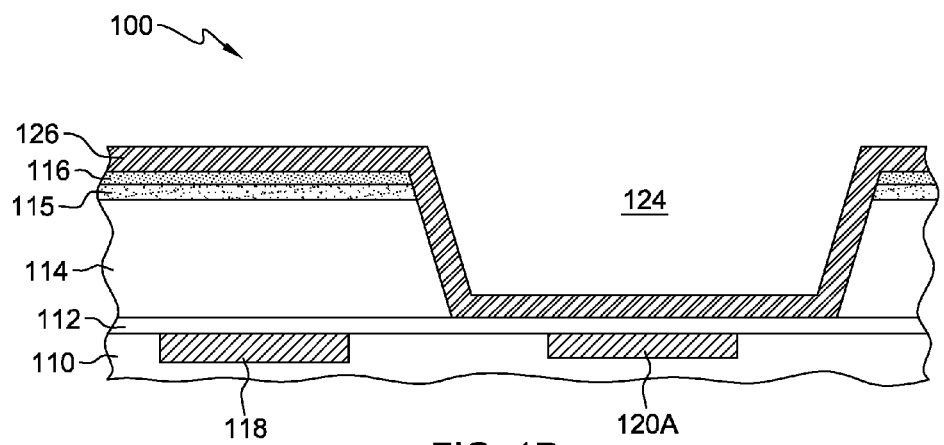

As depicted in FIG. 1D, after opening 124 formation, the photoresist is removed, and a conductive material layer 126 is conformally formed over device 100, including within opening 124. As described more fully below, a portion of conductive material layer 126 will eventually become the upper electrode for the MIM capacitor to be formed within the device. The conductive material layer 126 may be formed of any of a variety of different materials suitable as an electrode for the MIM capacitor, such as (for example) a metal, titanium, titanium nitride, tantalum, tantalum nitride, etc. In one specific example, conductive material layer 126 may be a layer of titanium nitride having a thickness of about 30-50 nm that is initially formed by performing a conformal PVD or CVD process.

Figure 1E:
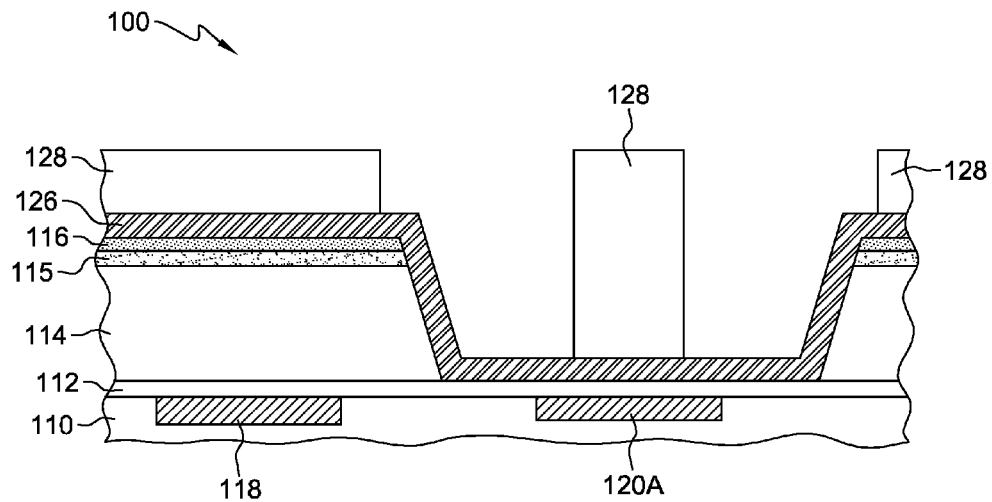
Figure 1F:
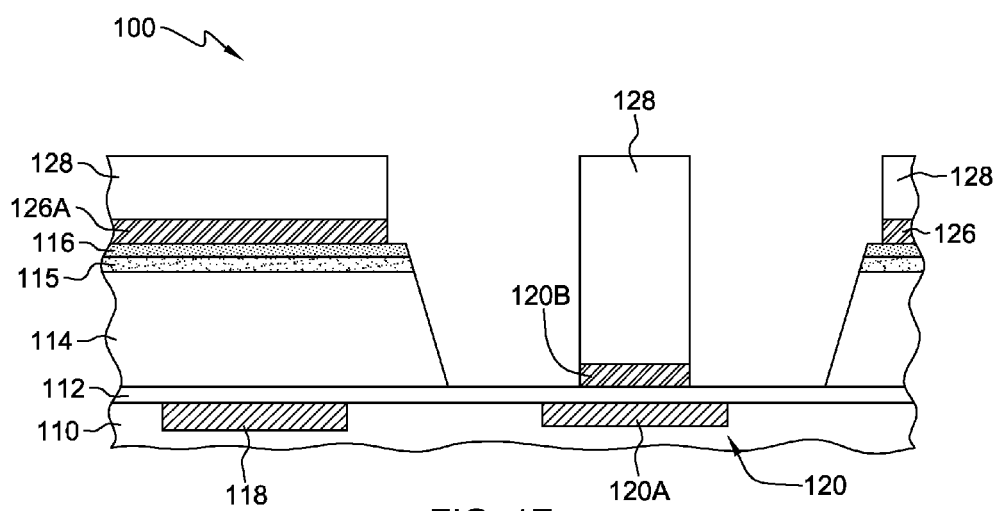
Figure 1G:
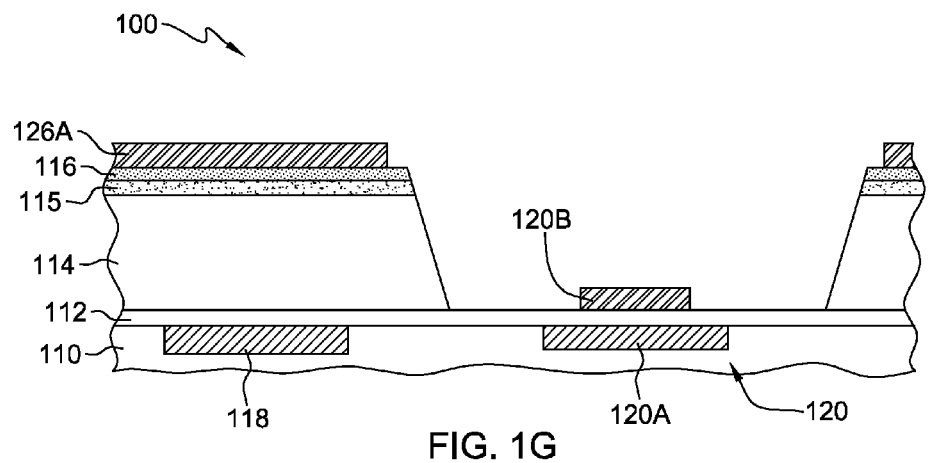

Thereafter, as illustrated in FIG. 1E, another patterned mask layer 128, e.g., a photoresist mask, is formed above conductive material layer 126. As shown in FIG. 1F, one or more etching processes are performed on conductive material layer 126 through patterned mask layer 128 to define upper electrode 120B of the MIM capacitor 120, and to define a conductive material hard mask 126A aligned above the conductive structure 118. Either dry or wet-etching processes may be employed in etching conductive material layer 126. In one illustrative embodiment, the conductive material layer 126 is etched by performing a dry anisotropic etching process. The size and configuration of upper electrode 120B and the conductive material hard mask 126A may vary, depending upon the particular application. After performing the etching, the pattern mask layer 128 of FIG. 1F is removed, as depicted in FIG. 1G.

Figure 1H:
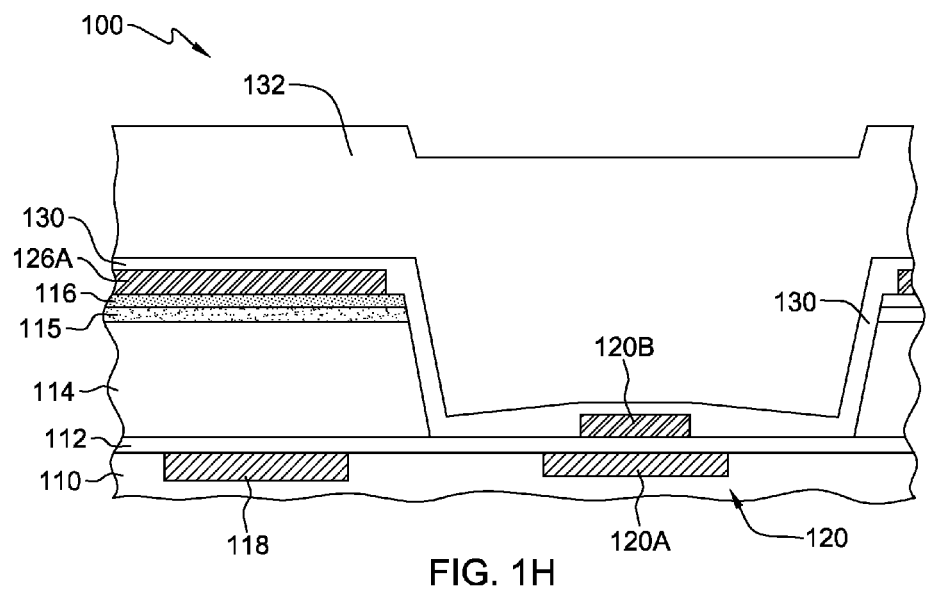

Next, as shown in FIG. 1H, in one illustrative process flow, a third hard mask layer 130 and a third layer of insulating material 132 are formed conformally over the device. It should be noted that third hard mask layer 130 may not be employed in all applications. In the illustrative process flow, third hard mask layer 130 will ultimately be used as a polish stop layer when a CMP process is performed to remove portions of the third layer of insulating material 132, as described more fully below. Thus, in this illustrative example, it may be beneficial to make the third hard mask layer 130 from a material that is harder than the material selected for the third layer of insulating material 132. In one illustrative embodiment, third hard mask layer 130 may be any of a variety of materials such as, for example, a TEOS-based silicon dioxide, silicon nitride, etc. In one specific example, third hard mask layer 130 may be a layer of TEOS-based silicon dioxide having a thickness of about 30-50 nm that is initially formed by performing a CVD process. In one illustrative embodiment, the third layer of insulating layer 132 may be any of a variety of materials, such as a so-called low-k insulating material (k value less than 2.7) or an ultra-low-k insulating material (k value of less than 2.3), etc. In one specific example, the third insulating layer 132 may be a layer of a low-k insulating material having a thickness of about 100-500 nm that is initially formed by performing a CVD process.

Figure 1I:
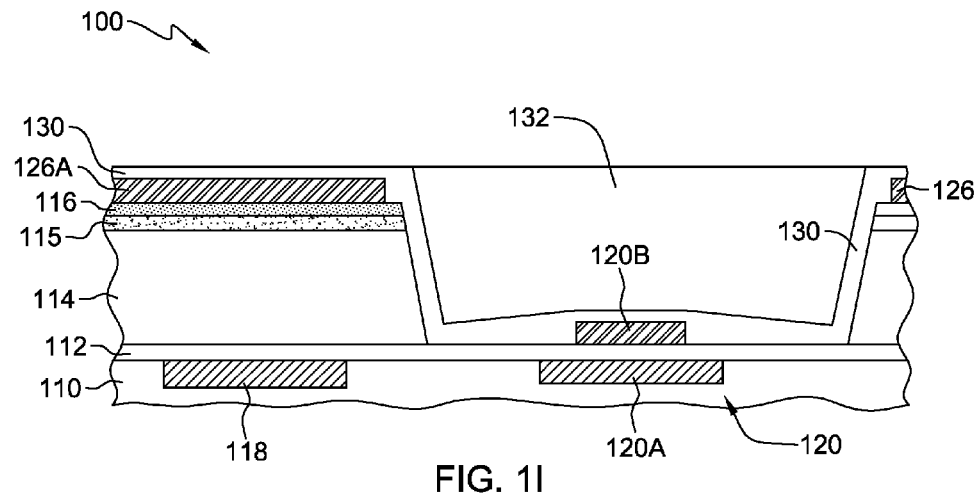

Next, as shown in FIG. 1I, one or more process operations are performed to remove portions of the third layer of insulating material 132. In one illustrative embodiment, a chemical-mechanical polishing (CMP) process is performed to remove the excess portions of the third layer of insulating material 132, with third hard mask layer 130 acting as a polish stop layer. In other applications, an etching process may be performed to remove the excess portions of the third layer of insulating material 132. Of course, if desired, a combination of a CMP process and an etching process may be employed in removing portions of the third layer of insulating material 132.

Figure 1J:
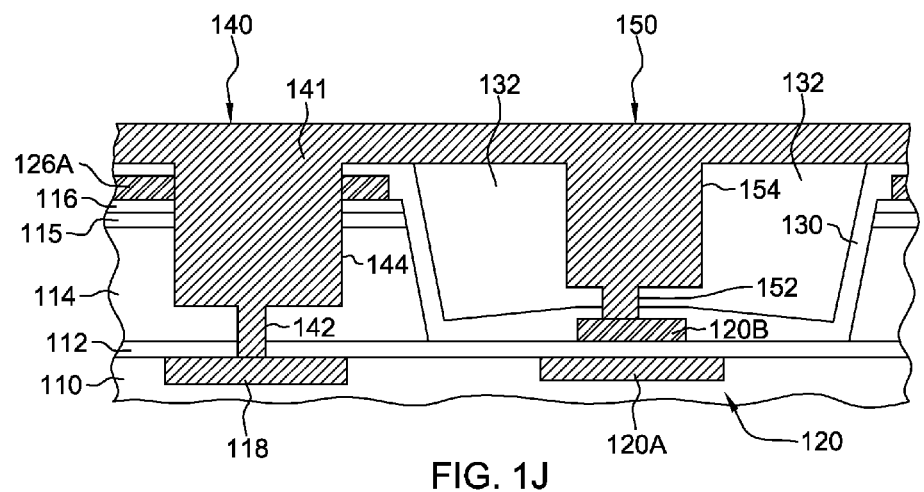

As shown in FIG. 1J, a plurality of process operations are next performed to form what will become a first conductive contact structure 140 and a second conductive contact structure 150. As illustrated, first conductive contact structure 140 conductively (i.e., electrically) couples to conductive structure 118, e.g., a metal line positioned in the first layer of insulating material 110, and second conductive contact structure 150 conductively contacts to one of the lower electrode 120A of capacitor 120, or the upper electrode 120B of capacitor 120. In the embodiment illustrated in FIG. 1J, second conductive contact structure 150 conductively contacts upper electrode 120B of the capacitor. The first and second conductive contact structures 140, 150 may be fabricated of a variety of materials, for example, copper, a metal, copper magnesium, silver, etc., and may be formed using a variety of known techniques. Thus, the particular material used for the conductive contact structures 140, 150, and the manner in which they are formed, should not be considered a limitation on the concepts disclosed herein. In one illustrative embodiment, first conductive contact structure 150 may include copper, and be formed using known damascene processing techniques, such as those described in U.S. Letters Pat. No. 6,649,464.

In general, as noted, copper damascene processing includes forming a trench or a copper structure in an insulating layer, forming a sufficient amount of copper to overfill the trench, and removing the excess copper from the substrate, thereby leaving the copper structure in the trench. In the example depicted herein, the first conductive contact structure 140 and second conductive contact structure 150 may be formed using a so-called via-first, trench-last technique. Using this technique, one or more first vias 142 and one or more second vias 152 are respectively formed over conductive structure 118 and upper electrode 120B. This is followed by forming trenches 144, 154 over the respective vias 142, 152. The trenches are formed through the various material layers depicted in FIG. 1J. This process includes forming an opening through the conductive material hard mask 126a, and the one or more first vias 142 and one or more second vias 152, respectively expose the underlying conductive structure 118 and upper electrode 120B. Thereafter, one or more layers of conductive material 141 are formed within the one or more first vias 142, the first trench 144, the one or more second vias 152, and the second trench 154. So as not to obscure the present invention, various details and layers associated with formation of the first conductive structure 140 and second conductive contact structure 150 are not depicted in the drawings. For example, one or more barrier layers (not shown) would typically be formed within the one or more first vias 142, the first trench 144, the one or more second vias 152, and the second trench 154, prior to depositing of the conductive material 141 therein.

Figure 1K:
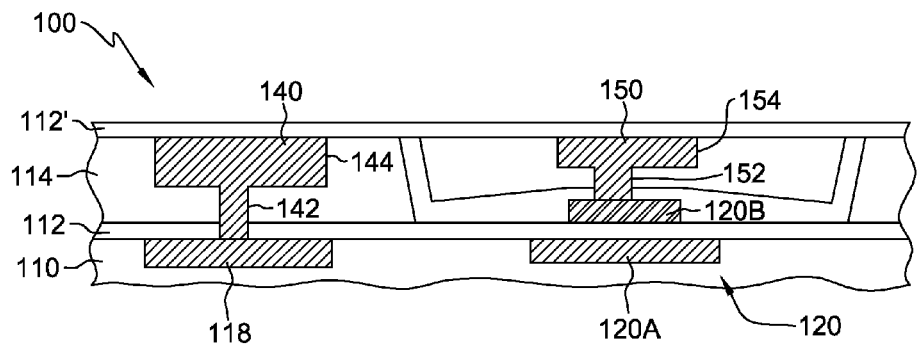

Next, as shown in FIG. 1K, a CMP process may be performed to reduce the first conductive contact structure 140 and second conductive contact structure 150 to a desired final height. This process also results in separating (or isolating) the first and second conductive contact structures in the example depicted. Note that the etching will be stopped on top of the third (i.e., conductive) hard mask layer 126A for first conductive contact structure 140, and on top of the conductive material comprising the second conductive contact structure 150. The metal removal may be stopped on top of the third hard mask layer 126A to facilitate the processing and provide a better form. Next, a second, non-conductive diffusion barrier layer 112' may be formed above device 100. This second, non-conductive diffusion barrier layer 112' will help prevent, or at least reduce, any undesirable migration of the conductive materials in the first conductive contact structure 140 and second conductive contact structure 150, and/or upper electrode 120B of the MIM capacitor 120. In the illustrative embodiment, the second conductive diffusion barrier 112' may be a layer of NBLoK™, having a thickness of about 20-40 nm, which may initially formed by performing a CVD process.

Figure 1L:
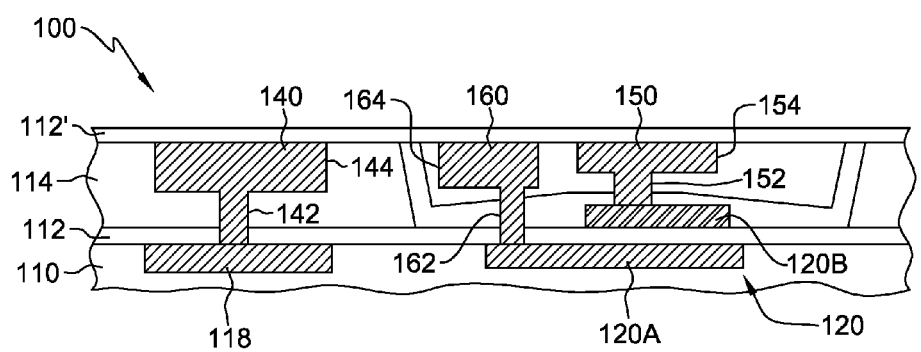

FIG. 1L depicts a variation on the device and process flow of FIGS. 1A-1K. In this embodiment, lower electrode 120A is sized and configured to allow for a third conductive contact structure 160 to conductively contact the lower electrode 120A. Forming the third conductive contact structure 160 may be readily accomplished simultaneously with forming of the first and second conductive contact structures 140, 150 by, for example, providing one or more third vias 162 exposing respective portions of lower electrode 120A, and a third trench 164 over the one or more third vias 162. Then, the one or more third vias and third trench are filled with conductive material 141 during the processing described above in connection with FIG. 1J. In this regard, FIGS. 2A-2C depict various lower electrode and upper electrode layouts.

Figure 2A:
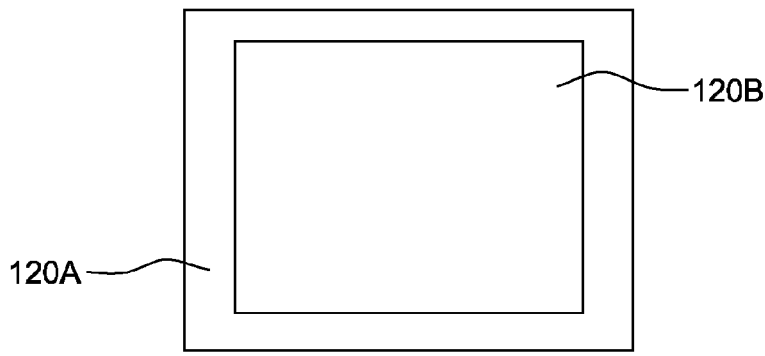
FIGS. 2A-2C are plan views of various capacitor configurations, in accordance with one or more aspects of the present invention.

In FIG. 2A, a basic capacitor layer is illustrated, wherein upper plate 120B is within the footprint of lower plate 120A. In this embodiment, the capacitor is defined within the overlap area between the upper and lower electrodes, e.g., plates.

Figure 2B:
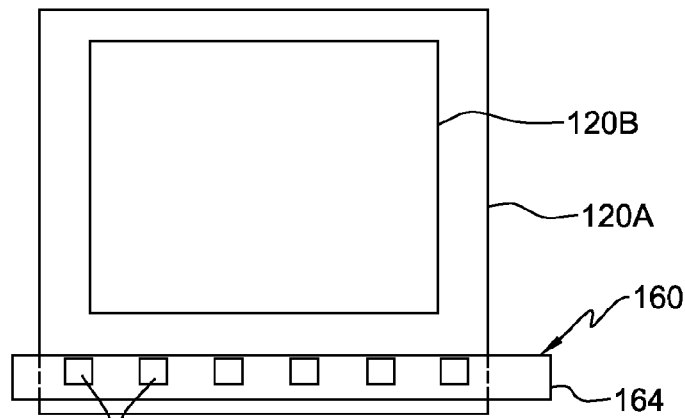

In FIG. 2B, the configuration of lower electrode 120A is adjusted to allow for third conductive contact structure 160 to electrically contact the electrode. In particular, as noted above, one or more third vias 162 and a third trench 164 may be formed and filled with conductive material to define the third conductive contact structure 160.

Figure 2C:
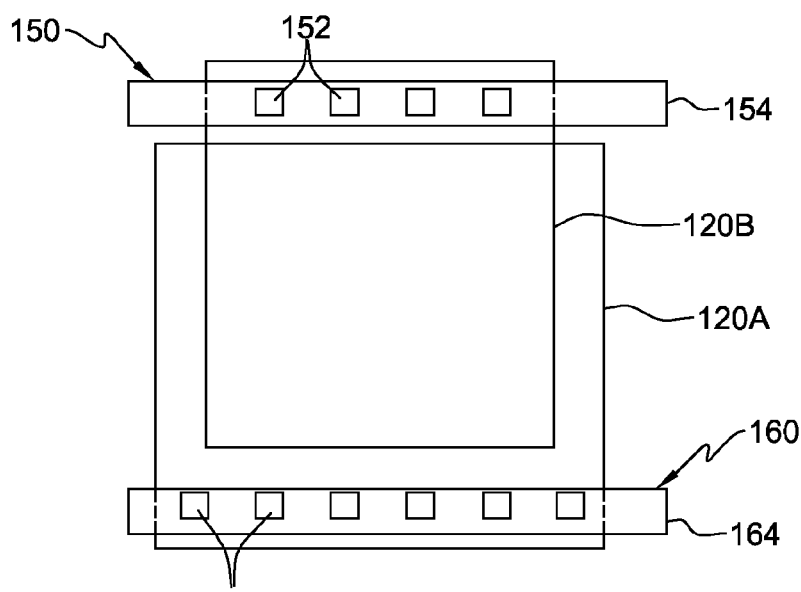

In the embodiment of FIG. 2C, upper plate 120B is also configured to allow for conductive contact by second conductive contact structure 150. In this embodiment, second conductive contact structure 150 includes a conductive material filling multiple second vias 152 and the second trench 154, as described above in connection with FIGS. 1K & 1L. Note that the particular electrode configurations and conductive contacts described in FIGS. 2B & 2C are provided by way of example only. Those skilled in the art will note that various different configurations could be employed to conductively contact the respective electrodes of the MIM capacitor.

Figure 3A:
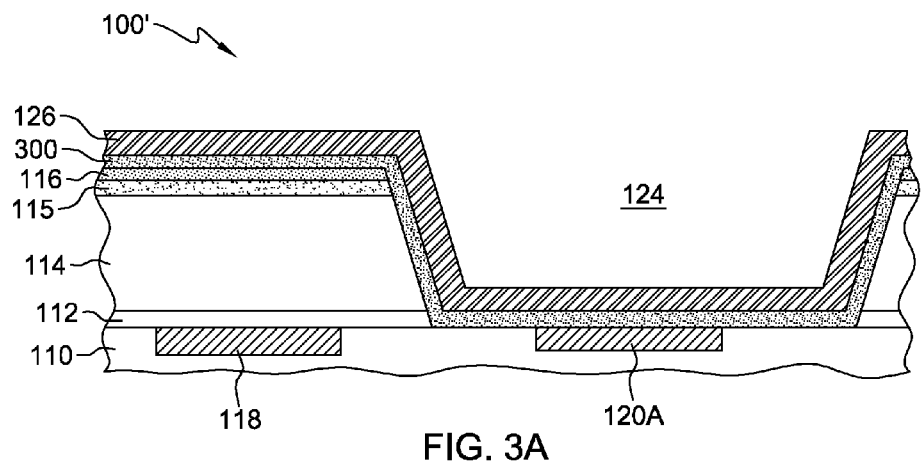
FIGS. 3A & 3B depict alternate methods of forming a device which includes a capacitor and multiple conductive contact structures, in accordance with one or more aspects of the present invention.
Figure 3B:
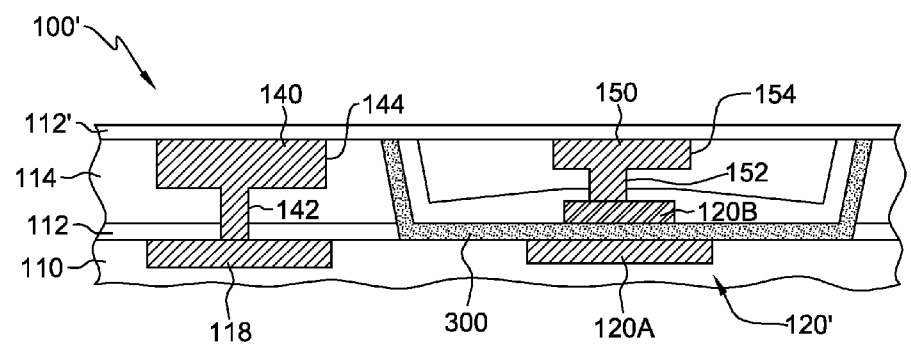

FIGS. 3A & 3B depict an alternate method of forming a device 100', which includes a capacitor and multiple contact structures, in accordance with one or more aspects of the present invention. In this embodiment, the device fabrication process described above in connection with FIGS. 1A-1K is modified to include, as illustrated in FIG. 3A, a dielectric layer 300 conformally formed over the device and within opening 124 prior to formation of the conductive material layer 126. This dielectric material layer 300 could be any of a variety of capacitance materials, such as simple TEOS, or a high-density capacitance material, or (for example) silicon nitride. The intermediate structure of FIG. 3A may be obtained by etching the non-conductive diffusion barrier layer 112 within opening 124 during the etching of pattern mask layer 122 (see FIG. 1C). After etching the non-conductive diffusion barrier layer 112 within opening 124 to, in part, expose lower electrode 120A, the dielectric material layer 300 may be deposited, after which conductive material layer 126 may be formed, as explained above. The result of this processing is illustrated in FIG. 3B, wherein the non-conductive diffusion barrier layer 112 is replaced between lower electrode 120A and upper electrode 120B, with the dielectric material layer 300, resulting in a capacitor 120' with one or more different performance characteristics compared with the capacitor described above in connection with FIGS. 1A-1K, wherein non-conductive diffusion barrier layer 112 resides between the electrodes.

Figure 4A:
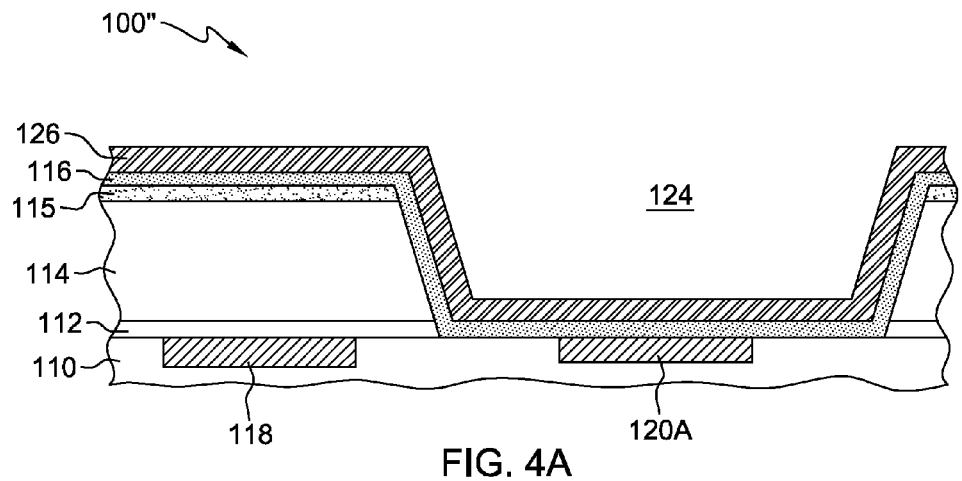
FIGS. 4A & 4B illustrate further alternative methods of forming a device which includes a capacitor and multiple conductive contact structures, in accordance with one or more aspects of the present invention.
Figure 4B:
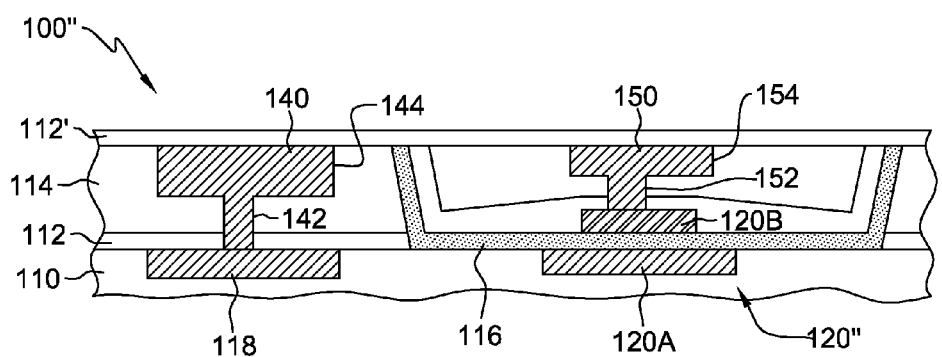

FIGS. 4A & 4B depict a further device 100" and process variation, wherein prior to formation of second hard mask layer 116, opening 124 is formed to expose lower electrode 120A. Thereafter, the second hard mask layer 116 could be conformally deposited over the device, including within opening 124 over electrode 120A. This second hard mask layer will then be used as the capacitance dielectric material. As described above in connection with FIGS. 1A-1K, the conductive material layer 126, for example, a titanium nitride film, is then deposited on top of the second hard mask layer 116. By employing as a capacitance material the second hard mask layer, additional cost savings may be obtained by the process illustrated. The resultant device is depicted in FIG. 4B, wherein the non-conductive diffusion barrier layer 112 is replaced by a portion of the second hard mask layer 116 between the upper and lower electrodes of the capacitor 120". This particular process may be advantageous where a higher-density dielectric material is desired between the electrodes. Using this process, any type of capacitance material may be employed, such as simple TEOS, or a high-density capacitance material, or (for example) silicon nitride.

Those skilled in the art will understand from the above description, that provided herein are processes for manufacturing devices which include one or more capacitors and multiple conductive contact structures to, for instance, a conductive structure of the device and one or more of the electrodes of the capacitor. Advantageously, the conductive contact structures, e.g., via contacts, are made at the same time using the same processing, without the addition of process steps to form, for example, the first conductive contact structure over the underlying conductive structure, or the second or third conductive contact structures to the electrodes of the capacitor. Employing the processing disclosed herein, an accurate and conformal MIM capacitor may be fabricated, together with the conductive contact structures between the electrodes (or plates) of the capacitor and the above metal layers. Advantageously, the processing disclosed herein may save costs in metal film deposition and oxide hard mask deposition steps, by optimizing the process sequence for the fabrication approach. The process could be easily used between any of the metal layers, such as the CA and metal 1 layer, the metal 1 layer and metal 2 layers, etc.

In accordance with an aspect of the invention, the upper electrode material is also employed as a conductive hard mask during the processing. Thus, the processing disclosed herein will save metal film deposition and oxide hard mask deposition steps by optimizing the process sequence while improving tool registration performance. Conductive contact structures may be formed to either or both the lower electrode and upper electrode at the same time that contact vias are formed within the structure.

The processing disclosed herein advantageously saves, at least, two deposition steps, that is one for a metal thin-film deposition, and the other for oxide film deposition. In addition to the cost savings, the concepts disclosed herein present a method of making a MIM capacitor with conductive contact structures that could be used below 32 nm fabrication technology. As the design world becomes smaller, it is more difficult to align next-level to the current-level, and therefore, self-aligning techniques minimize misalignment. In a back-end-of-line process, a conductive hard mask is often used in a self-align methodology. In addition, the processing disclosed herein presents a solution for contacting the electrodes of a MIM capacitor using conductive contact structures, e.g., contact vias, made at the same time as the next-level metallization, which could give a designer more freedom of design. The processes and devices disclosed herein are particularly useful for analog and RF products which use MIM capacitors.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A device comprising:
a conductive structure and a lower electrode of a capacitor disposed within an insulating layer;
a layer of conductive material disposed above the conductive structure and the lower electrode of the capacitor, the layer of conductive material being etched to define a conductive material hard mask and an upper electrode of the capacitor, the conductive material hard mask being disposed at least partially above the conductive structure; and
a first conductive contact structure and a second conductive contact structure, the first conductive contact structure extending through an opening in the conductive hard mask and conductively contacting the conductive structure, and the second conductive contact structure conductively contacting one of the lower electrode of the capacitor or the upper electrode of the capacitor.

2. The device of claim 1, further comprising a non-conductive diffusion barrier layer disposed over the conductive structure.

3. The device of claim 2, wherein the non-conductive diffusion barrier layer is further disposed over the lower electrode of the capacitor, between the lower and upper electrodes of the capacitor.

4. The device of claim 1, wherein the second conductive contact structure conductively contacts the upper electrode of the capacitor, and in a third conductive contact structure conductively contacts the lower electrode of the capacitor.

5. The device of claim 1, wherein the conductive structure and the lower electrode of the capacitor are formed in a layer of insulating material.

6. The device of claim 2, wherein the non-conductive diffusion barrier layer comprises the non-conductive layer exposed by the opening above the lower electrode.

7. The device of claim 6, wherein the non-conductive diffusion barrier layer separates the lower and upper electrodes of the capacitor.

8. The device of claim 2 wherein further comprising the non-conductive diffusion barrier layer remaining disposed over the conductive structure.

9. The device of claim 1, wherein the layer of conductive material comprises at least one of a metal, titanium, tantalum, titanium nitride, or tantalum nitride.

10. The device of claim 1, wherein the conductive structure comprises a conductive metal line.

11. The device of claim 1, wherein the first conductive contact structure and the second conductive contact structure comprise a first conductive copper line and at least one first conductive copper via in conductive contact with the conductive structure, and a second conductive copper line and at least one second conductive copper via in conductive contact with one of the lower electrode of the capacitor or the upper electrode of the capacitor.

12. The device of claim 5, wherein the conductive structure and the lower electrode comprise copper.

13. The device of claim 1, wherein the lower electrode and the upper electrode comprise different conductive materials.

14. A device comprising:
a conductive structure and a lower electrode of the capacitor;
a non-conductive diffusion barrier layer over the conductive structure and the lower electrode of the capacitor;
a layer of conformal material above the conductive structure, and above the lower electrode of the capacitor;
a conductive material hard mask and an upper electrode of the capacitor, the conductive material hard mask being disposed at least partially above the conductive structure;
a first conductive contact structure and a second conductive contact structure, the first conductive contact structure extending through an opening in the conductive material hard mask and conductively contacting the conductive structure, and the second conductive contact structure conductively contacting one of the lower electrode of the capacitor or the upper electrode of the capacitor; and
a portion of dielectric layer residing between the lower electrode and upper electrode of the capacitor, and the non-conductive diffusion barrier layer remaining disposed over the conductive structure.

15. A device comprising:
a conductive structure and a lower electrode of the capacitor;
a non-conductive diffusion barrier layer over the conductive structure and the lower electrode of the capacitor;
a layer of conformal material above the conductive structure, and above the lower electrode of the capacitor;
a conductive material hard mask and an upper electrode of the capacitor, the conductive material hard mask being disposed at least partially above the conductive structure;
a first conductive contact structure and a second conductive contact structure, the first conductive contact structure extending through an opening in the conductive material hard mask and conductively contacting the conductive structure, and the second conductive contact structure conductively contacting one of the lower electrode of the capacitor or the upper electrode of the capacitor; and
a portion of a hard mask layer residing between the lower and upper electrodes of the capacitor, and the non-conductive diffusion barrier layer remaining disposed over the conductive structure.

* * * * *